US 6,567,271 B2

(12) United States Patent
Stone et al.

(10) Patent No.: US 6,567,271 B2
(45) Date of Patent: May 20, 2003

(54) CIRCUIT BOARD INTERCONNECTION AND FAN-MOUNTING ASSEMBLY FOR CONVECTIVE COOLING

(75) Inventors: Dennis Stone, Costa Mesa, CA (US); William Vu, Laguna Niguel, CA (US); Ryan Tze, Irvine, CA (US); Ralph Laing, Rolling Hills Estates, CA (US)

(73) Assignee: Toshiba America Information Systems, Inc., Irvine, CA (US)

( * ) Notice: Subject to any disclaimer, the term of this patent is extended or adjusted under 35 U.S.C. 154(b) by 71 days.

(21) Appl. No.: 09/800,236

(22) Filed: Mar. 5, 2001

(65) Prior Publication Data

US 2002/0122296 A1 Sep. 5, 2002

(51) Int. Cl.[7] .................................................. G06F 1/20
(52) U.S. Cl. ........................................ 361/724; 361/725
(58) Field of Search ................................ 361/724–730, 361/733, 735–737, 741, 742, 748, 756, 758, 760, 785, 788, 790, 791, 804

(56) References Cited

U.S. PATENT DOCUMENTS

| 4,356,531 A | 10/1982 | Marino et al. |
| 4,401,351 A | 8/1983 | Record |
| 4,739,445 A | 4/1988 | Tragen |
| 4,751,872 A | 6/1988 | Lawson, Jr. |
| 4,767,262 A | 8/1988 | Simon |
| 5,124,885 A | 6/1992 | Liu |
| 5,191,230 A | 3/1993 | Heung |
| 5,208,730 A | 5/1993 | Tracy |
| 5,338,214 A | 8/1994 | Steffes et al. |
| 5,432,674 A | 7/1995 | Hardt |
| 5,788,566 A | 8/1998 | McAnally et al. |
| 5,793,998 A | * 8/1998 | Copeland et al. ........... 395/309 |
| 5,831,525 A | 11/1998 | Harvey |
| 5,903,439 A | 5/1999 | Tamarkin |
| 5,978,219 A | 11/1999 | Lin |
| 6,002,586 A | 12/1999 | Chen et al. |
| 6,040,981 A | 3/2000 | Schmitt et al. |
| 6,061,237 A | 5/2000 | Sands et al. |
| 6,105,091 A | 8/2000 | Long |
| 6,115,250 A | * 9/2000 | Schmitt ...................... 361/695 |
| 6,171,120 B1 | 1/2001 | Bolich et al. |

* cited by examiner

Primary Examiner—Darren Schuberg
Assistant Examiner—Yean-Hsi Chang
(74) Attorney, Agent, or Firm—Pillsbury Winthrop LLP

(57) ABSTRACT

An electronic system comprising a plurality of circuit boards and/or drives mounted in a stack within a housing. Interconnectors are provided between the circuit boards and/or drives to connect the circuit boards and/or drives and to provide vertical separations between the circuit boards and/or drives. A cooling fan is slidably disposed adjacent a wall of the housing to create a horizontal stream of air that flows through the separations and over the top and bottom surfaces of the circuit boards and/or the drives. This provides for convective cooling in an efficient manner, while minimizing the profile of the electronic system.

35 Claims, 12 Drawing Sheets

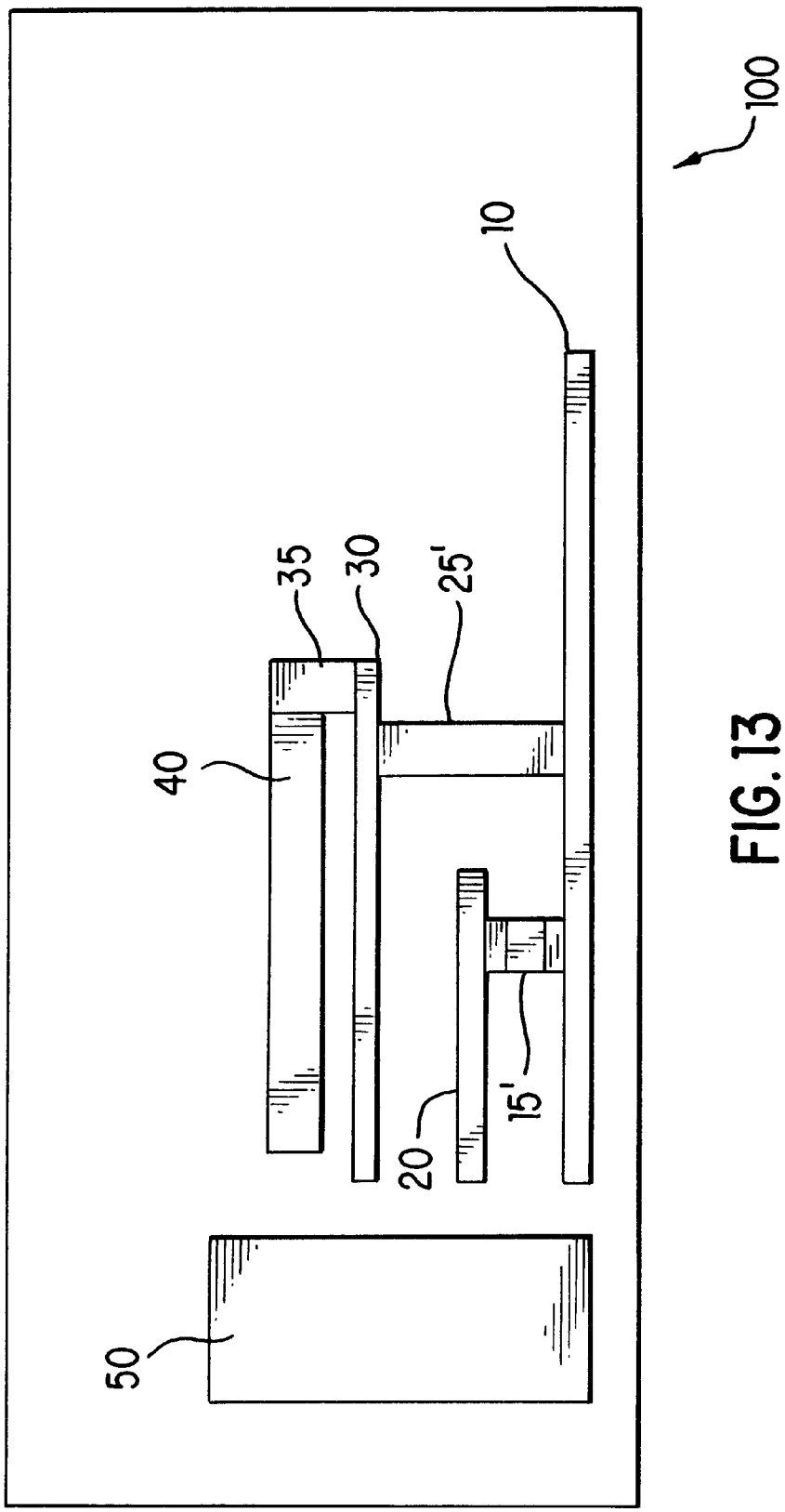

CIRCUIT BOARD INTERCONNECTION AND FAN-MOUNTING ASSEMBLY FOR CONVECTIVE COOLING

BACKGROUND OF THE INVENTION

1. Field of the Invention

The present invention generally relates to the field of connection assemblies for electronic components which may be used in conjunction with a cooling mechanism. More specifically, the present invention relates to a system and method of providing separation between circuit boards to allow convective cooling via a slidably-mounted fan, while, at the same time, minimizing the profile of an electronic system that contains the circuit boards.

2. Discussion of the Related Art

Most electronic devices today, including computer systems and appliances, server systems and appliances, stereo systems, and video and/or audio player systems—e.g., compact disc (CD), video compact disc (VCD), digital versatile disc (DVD) and videocassette recorder (VCR) players—are housed in rectangular metal boxes. The boxes vary in size depending on the complexity of the systems therein and the number of components required to implement the systems. A less complex system, such as a video and/or audio player system and a system performing simple functions, is often enclosed in a single small box because fewer components are needed for performing the simple functions. In contrast, a more complex system is either enclosed in a large box or composed of several units that are connected together during operation. For example, in a server system or appliance that manages network resources, processes data, directs network traffic, stores information and connects workstations to the Internet in a small network, several units are required. A server unit is needed for managing network resources, such as printers, disk drives and memory. The server unit may, for example, be dedicated to store files, control printers and manage network traffic and process database queries. A hub unit is needed for connecting the plurality of workstations in the network, providing a common connection point for devices in the network. Typically, the hub unit contains multiple ports, and when a packet arrives at one port, it is copied to the other ports so that all segments of the network can see all of the packets. A router unit and/or switch unit may also be needed to control data traffic from the workstations or the server unit to the Internet and from the Internet to the workstations or the server unit.

A computer system, such as a desktop computer, or an individual unit within the server system as described above, generally includes various circuit boards having computer chips and other electronic components that allow the computer system to operate. Typical circuit boards in a computer system include a motherboard and expansion cards. The motherboard is the main circuit board in the computer, and it contains the computer's basic circuitry and components. The computer components contained in the motherboard include microprocessor, coprocessors, memory, basic input/output system, expansion slots, and interconnecting circuitry. Additional components are usually added to the motherboard through its expansion slots. The expansion cards—e.g., memory, controller boards, network interface card, video adapters and internal modems—are plugged into the expansion slots on the motherboard to add additional functions or resources to the computer system. Sometimes the requirements for input/output ("I/O") pin connections between circuit cards and motherboards exceed the available circuit card edge length and exceed the maximum available connector pin density. In this case, a supplemental card is mounted to the motherboard in order to provide additional connectors and I/O pins.

In operation, heat is produced from the circuitry and components on the circuit cards and the motherboard. Heat is also produced from a power supply that powers the computer system as well as a storage device, such as a hard disk drive. Because high temperatures can have an adverse effect on the circuitry and components in the computer system, a fan is usually provided to regulate the internal temperature of the computer system.

In conventional systems, one or more fans are typically mounted to the rear wall of the structure that houses the circuitry and components. In such systems, the fan is placed so as to provide direct cooling to the central processing unit (CPU), which is usually disposed on the motherboard and produces the most amount of heat as compared to other components of the system. However, given the physical structure of the circuit cards and other components of existing systems (as will be described further below), a rear-mounted fan may provide inadequate cooling to heat-generating components other than the CPU.

Moreover, regardless of the actual location of the fan, existing systems require that the fan be attached to the housing using screws or other similar, semi-permanent means of attachment. In such systems, each fan is typically provided with a rectangular frame. The frame, in turn, either has several screw holes, usually located at its corners, or a tab or similar structure which extends from the frame and is adapted to be fastened to the housing. In either case, the requirement and practice of attaching the fan to the housing in a semi-permanent manner necessitate a somewhat complex, and thus, costly, manufacturing process. In addition, the installation, as well dismounting (e.g., for maintenance purposes), of such an assemblage are time- and labor-intensive.

As mentioned previously, the ability of a conventional cooling system to regulate the internal temperature of a computer system is very much dependent on the internal structure of the circuitry and components of the system. In this regard, there are two conventional ways of connecting the circuit cards together with the motherboard. In the first, the circuit cards are plugged perpendicularly into the motherboard. In the second, the circuit cards are first fixed with screws at various positions above the motherboard, and connection cables or lines are provided to connect the circuit cards with expansion slots on the motherboard. In the first configuration, because the circuit cards are perpendicularly plugged into the motherboard, the whole surface area of the circuit cards will block the flow of (cooling) air over the area behind the circuit cards. This alters the internal airflow patterns inside the computer system, which may adversely affect cooling of the circuitry and components within the computer system. Therefore, critical circuitry and components within the computer system may fail because of overheating.

The second configuration, wherein screws are used to fix the circuit cards, is provided in a computer system that is housed within a big box, such as the box that houses a desktop computer. This large form factor makes it difficult to transfer. Moreover, because the connection cables or lines are flexible and not rigid, it is difficult to predict their shape and location upon installation. Oftentimes, they can also alter the internal airflow pattern inside the computer system and adversely affect cooling of particular circuitry and components within the computer system.

In both configurations, it is not possible to both provide airflow in an efficient and simple manner and, at the same time, minimize the profile of a computer system, such as to the size of a notebook. Therefore, there is a need for a system and method for providing separation between circuit boards to allow convective cooling while minimizing the profile of a computer system that houses the circuit boards.

BRIEF DESCRIPTION OF THE DRAWINGS

The accompanying drawings, which are incorporated in, and form a part of, this specification, illustrate embodiments of the present invention and, together with the description, serve to explain the principles of the present invention:

FIG. 13 illustrates a side view of the inside of a server appliance having circuit boards and interconnectors connecting them according to an embodiment of the present invention.

DETAILED DESCRIPTION

Reference will now be made in detail to the preferred embodiments of the invention, examples of which are illustrated in the accompanying drawings. While the present invention will be described in conjunction with the preferred embodiments, it will be understood that they are not intended to limit the invention to these embodiments. On the contrary, the present invention is intended to cover alternatives, modifications, and equivalents which may be included within the spirit and scope of the invention as defined by the appended claims. Moreover, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components and circuits have not been described in detail so as not to unnecessarily obscure aspects of the present invention.

Figure 1:
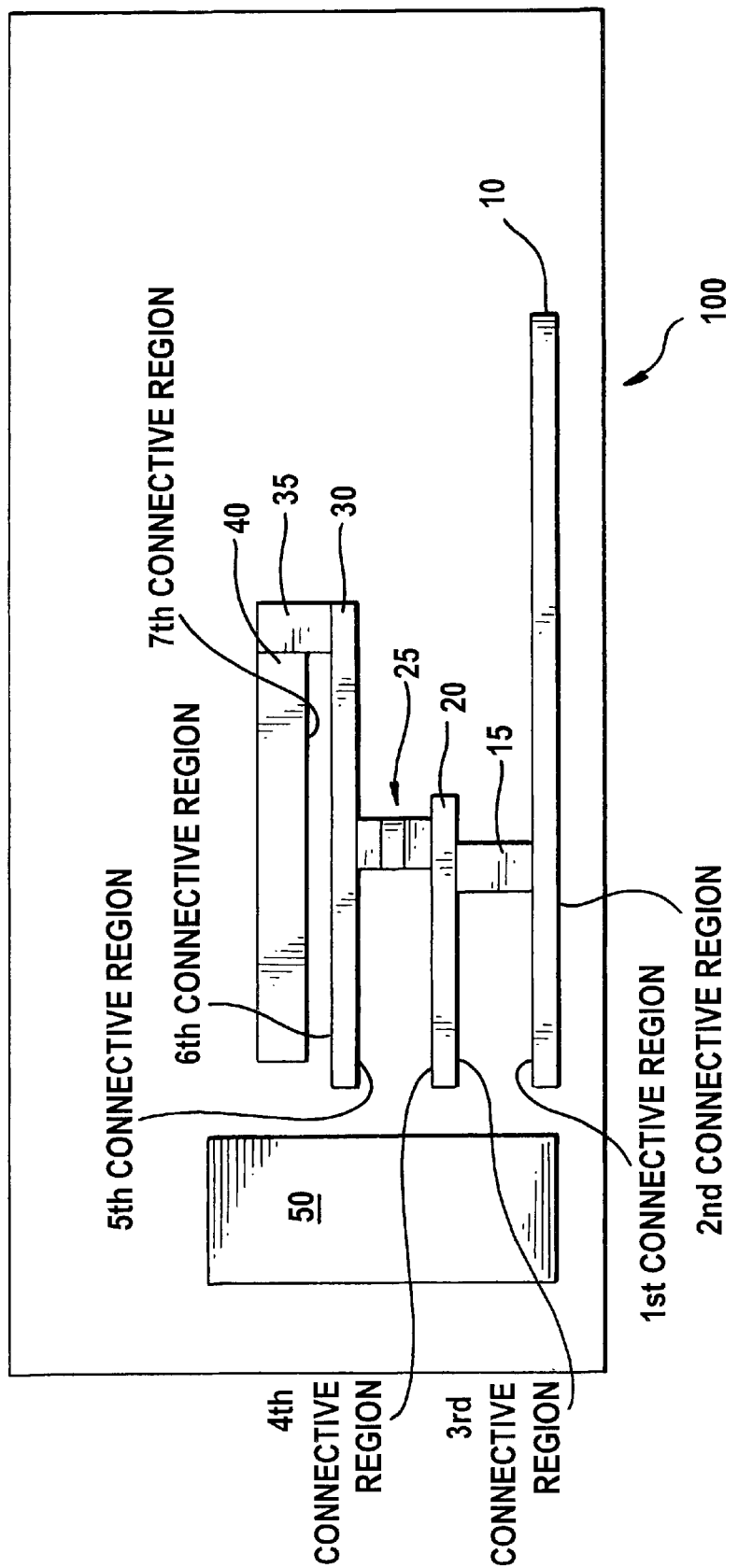
FIG. 1 illustrates a side view of the inside of an electronic system having circuit boards and interconnectors connecting them according to an embodiment of the present invention.

With reference now to the figures, FIG. 1 illustrates a side view of the inside of an electronic system having circuit boards and interconnectors connecting them in accordance with an embodiment of the present invention. The electronic system 100 may, for example, be utilized to house a computer system or a server appliance. The electronic system 100 includes a single rectangular chassis that houses components of the electronic system 100, the chassis having a plurality of outer surfaces. In another implementation, the electronic system 100 may include a chassis tray and a chassis cover, both slidably engageable to form the electronic system 100. In this case, the chassis tray has a front surface, a back surface, two inner side surfaces, and a bottom surface, while the chassis cover has a top surface and two outside surfaces. Within the chassis, circuit boards are mounted in a stack with vertical separations between them.

The circuit boards, as referred to herein, are flat pieces of nonconductive thin plate on which computer microprocessors and other electronic components are placed and electrically connected by thin strips of metal. The circuit boards may, for example, be a motherboard, supplemental card portions, expansion boards, and adapters. The supplemental card portions may, for example, be mezzanine cards or daughter cards that are mounted to the main circuit card, such as a motherboard. In a first preferred embodiment, the electronic system 100 includes a motherboard 10, a daughter card 20, and a mezzanine board 30. The three circuit boards are stack mounted, and each board is parallel with the others. In the stack, the circuit boards have vertical separations between them. The separations between the three circuit boards are created by interconnectors 15, 25 that electrically connect any two of the circuit boards together. In the configuration shown in FIG. 1, the interconnectors 15, 25 are perpendicular to the circuit boards.

Figure 2:
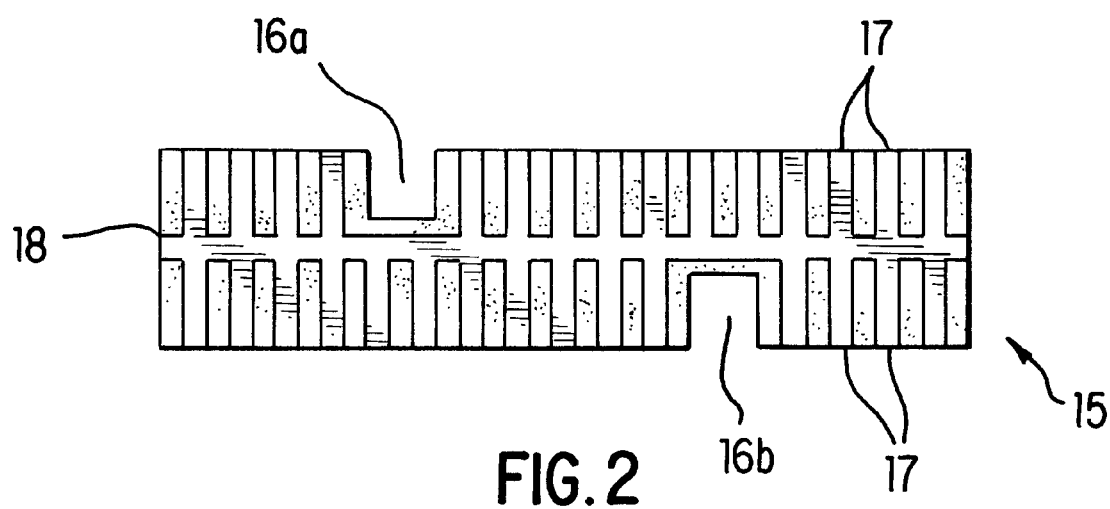
FIG. 2 illustrates a first interconnector that connects a motherboard with a first supplemental card portion positioned above the motherboard according to an embodiment of the present invention.

FIG. 2 is an illustrative example of the interconnector 15 that connects a motherboard with a supplemental card portion positioned above the motherboard according to an embodiment of the present invention. In this case, the supplemental card portion is the daughter card 20, and the interconnector 15 electronically connects the daughter card 20 with the motherboard 10. In one implementation, the interconnector 15 is a Peripheral Component Interconnect (PCI) slot extender card. Provided on the top surface of the motherboard 10 is a connective region in the form of a PCI slot. The bottom surface of the daughter card 20 also has a connective region in the form of a PCI slot. The PCI slot extender card 15 fits vertically into the PCI slot connective regions on the top surface of the motherboard 10 and the bottom surface of the daughter card 20.

In one implementation, the PCI slot extender card 15 has a notch on each side. The notch on each side matches a locking feature on the corresponding PCI slot, allowing the PCI slot extender card 15 to be properly inserted into the PCI slots. For example, the notch 16a matches the locking feature on the PCI slot located on the bottom surface of the daughter card 20. Similarly, the notch 16b matches the locking feature on the PCI slot located on the top surface of the motherboard 10. The conductors 17 for each side of the PCI slot extender card 15 are connected to a central bridge 18 that forms a strip down the center of the PCI slot extender card 15. This electrically connects pins 17 from one side with pins 17 from the other side. In other embodiments, the bridge is designed to accommodate any desired scheme for interconnecting pins on either side of the PCI slot extender card 15.

Figure 3:
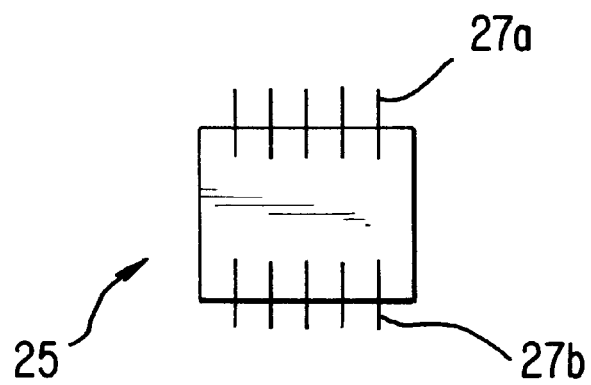
FIG. 3 illustrates a second interconnector that connects a first supplemental card portion with a second supplemental card portion positioned above the first supplemental card portion according to an embodiment of the present invention.

FIG. 3 illustrates an example of the interconnector 25 that connects a supplemental card portion with another supplemental card portion positioned in parallel with on another according to an embodiment of the present invention. In this case, one of the supplemental card portions is the daughter card 20 and the other supplemental card portion is the mezzanine board 30. The interconnector 25 connects the mezzanine board 30 with the daughter card 20. In this example, the interconnector 25 is a male—male connector, i.e., a connector having conductive pins 27a, 27b protruding and exposed from both faces. Provided on the top surface of the daughter card 20 is a connective region in the form of a female connector, which contains holes in which a male connector can be inserted. The bottom surface of the mezzanine board 30 also has a connective region in the form of a female connector. The interconnector 25 electrically connects the female connector mounted on the bottom surface of the mezzanine board 30 with the female connector mounted on the top surface of the daughter card 20.

In another implementation, the male—male interconnector 25 is the same type of connector that is typically mounted on a circuit board as a male connector. That is, the interconnector 25 is integrated with, and mounted on, the daughter card 20, forming a male connector 25. When the interconnector is mounted on a circuit board, however, one set of conductive pins is generally trimmed so as not to protrude through the back surface of the circuit board. In this case, since the male connector 25 is mounted on the daughter card 20, pins 27b on the bottom side of the male—male connector shown in FIG. 3 are trimmed. The male connector 25 has exposed pins on the side opposite to the side being mounted on the daughter card 20. The exposed pins are inserted into the holes of the female connector on the mezzanine board 30. In another embodiment, the location of the male connector 25 and the female connector is reversed.

The male connector is integrated with, and mounted on, the mezzanine board 30, while the female connector is mounted on the daughter card 20.

In one embodiment, a storage drive 40, in the form of a hard disk drive (HDD), is further mounted over the backside of the mezzanine board 30 through a HDD connector 35. The HDD connector 35 may, for example, be a pin connector. As represented in the embodiment depicted in FIG. 1, the backside of the mezzanine board 30 is the top surface of the mezzanine board 30 because the mezzanine board 30 is attached in reverse, wherein most of the circuitry and components attached thereto are on the bottom surface of the mezzanine board 30 and away from the HDD 40. The HDD 40 is connected in such a fashion as to be parallel to the mezzanine board 30 (and, thus, parallel with the motherboard 10 and the daughter card 20 as well). The HDD connector 35 is vertically positioned, so that a small gap clearance (e.g., 75 mm) or vertical separation (as shown in FIG. 1) separates the bottom surface of the HDD 40 or a cage (not shown) storing the HDD 40 and the mezzanine board 30, or other partition. This allows heat generated by the HDD 40 to be transferred to the surrounding air without being transferred through the mezzanine board 30 (or other partition), or vice versa, from the circuitry and components on the mezzanine board 30 (or other partition) into the HDD 40.

In the preferred embodiment, a cooling fan 50 is provided to the left (when viewing the electronic system from the rear) of the circuit boards 10, 20, 30 and the storage drive 40. In other embodiments, a plurality of cooling fans or other conventional airflow-producing means is used to provide convective cooling. The cooling fan 50 does not necessarily have to be positioned to the left of the circuit boards 10, 20, 30. It may be placed in other positions, as long as it is positioned vertically with respect to the circuit boards 10, 20, 30 so as to provide a stream of airflow across the top and bottom surfaces of the circuit boards 10, 20, 30. In an illustrative example, the fan 50 may be rectangular in shape, with a bottom surface, a top surface, two side surfaces, a rear air-inlet side, and a front air-outlet side.

In FIG. 1, airflow from the cooling fan 50 passes across five surfaces that require cooling: (a) the top surface of the motherboard 10; (b) the top surface of the daughter card 20; (c) the bottom surface (i.e., front side) of the mezzanine card; (d) the top surface of the HDD 40; and (e) the bottom surface of the HDD 40. These surfaces require cooling because heat is produced at these sites during the operation of the electronic system 100. Most of the circuitry and electronic components on the circuit boards 10, 20, 30 are located on the top surface of the motherboard 10, the top surface of the daughter card 20, and the bottom surface of the mezzanine card 30, respectively. During operation, the circuitry and electronic components can produce and retain a large amount of heat if no air circulation is provided. Moreover, operation of the HDD 40 involves rapid mechanical movements, which also produces heat.

In conjunction with the cooling fan 50, openings are provided on the surfaces of the chassis as well as different trays and cages that house components of the electronic system 100. These openings serve as vents to allow cooling air to pass over and under the surfaces of the circuit boards 10, 20, 30 and HDD 40 and provide convective cooling. For example, the HDD 40 may be enclosed in a HDD tray that is within a HDD cage which, in turn, may have openings that serve as vents. The power supply within the electronic system is also likely to be enclosed in a power supply cage, which may also have openings that serve as vents. In operation, the cooling fan 50 produces airflow that travels through the various openings and over the surfaces of the circuit boards 10, 20, 30 and HDD 40.

More specifically, with reference to a preferred embodiment of the present invention shown in FIGS. 4–8, the electronic system 100 includes a chassis tray 80 and a chassis cover (or sleeve) 90, which are slidably engageable with one another. In this embodiment, the chassis tray 80 has a front surface 81, a back surface 82, two inner side surfaces 83, 84, and a bottom surface 85, while the chassis cover 90 has a top surface 96 and two sleeve surfaces 98, 99. Within the chassis tray 80, circuit boards are mounted in a stack with vertical separations between them.

Figure 4:
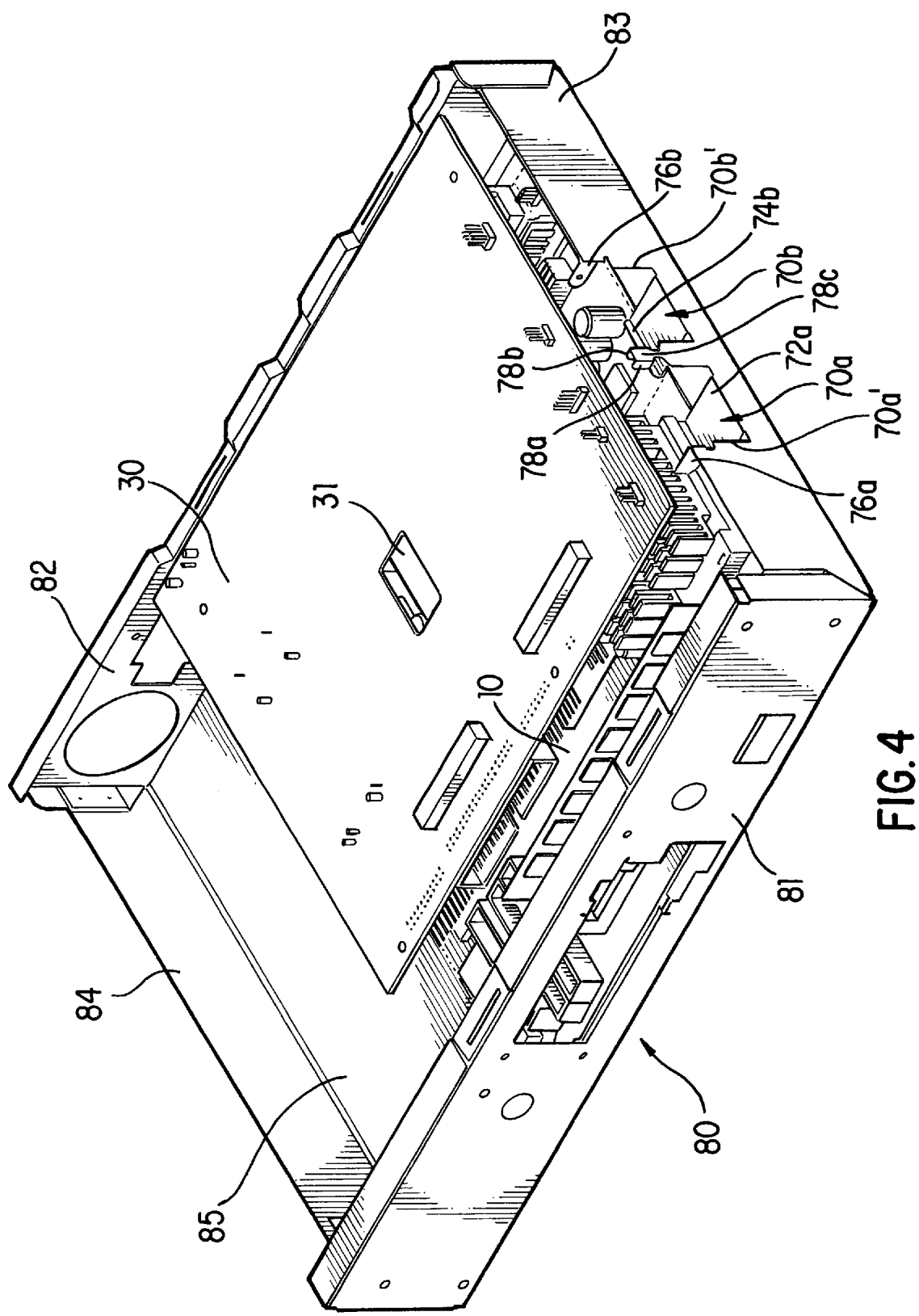
FIG. 4 illustrates a viewing region in a second supplemental card portion for facilitating an alignment process according to an embodiment of the present invention.

For illustrative purposes, the embodiment depicted in FIGS. 4–8 is equipped with two fans 50a and 50b, each of which is slidably received within the inner space of the chassis tray 80. Specifically, as shown in FIG. 4, a side surface 83 of the chassis tray 80 includes a pair of fan-mounting grooves 70a, 70b. In this embodiment, each of the grooves 70a, 70b is of a generally rectangular shape and is configured such that, once the fans 50a, 50b have been installed, the grooves 70a, 70b will be disposed adjacent the air-inlet side of each of the fans. However, the groove may have a circular, elliptical, or other configuration. It is also noted that, although the following description will refer to only one of the grooves 70a, 70b, one of the fans 50a, 50b, etc., it is to be understood that the description applies equally to other similar structural members and/or components.

The chassis tray 80 also includes a shelf 72a for supporting the fan 50a. The shelf 72a is a flange-like structure that is attached to an inner portion of the side surface 83, just beneath the groove 70a, and extends horizontally inward (i.e., toward the side surface 84 of the chassis tray 80). At its free distal end, the shelf 72a includes a lip 74a that wraps around the front (i.e., air-outlet) side of the fan 50a in a direction that is substantially perpendicular to the plane of the shelf 72a.

In a preferred embodiment, a tab 76a is attached to an inner portion of the side surface 83 and is disposed adjacent the edge 70a' of the groove 70a that is closest to the front surface 81 of the chassis tray 80. The tab 76a lies in a plane that is perpendicular to both the plane of the shelf 72a and the side surface 83, and extends inwards towards the side surface 84 of the chassis tray 80. Similarly, a tab 76b is attached to an inner portion of the side surface 83 and is disposed adjacent the edge 70b' of the groove 70b that is closest to the rear surface 82 of the chassis tray 80. The tab 76b lies in a plane that is perpendicular to both the plane of the shelf 72b and the side surface 83, and extends inwards towards the side surface 84 of the chassis tray 80.

Figure 7:
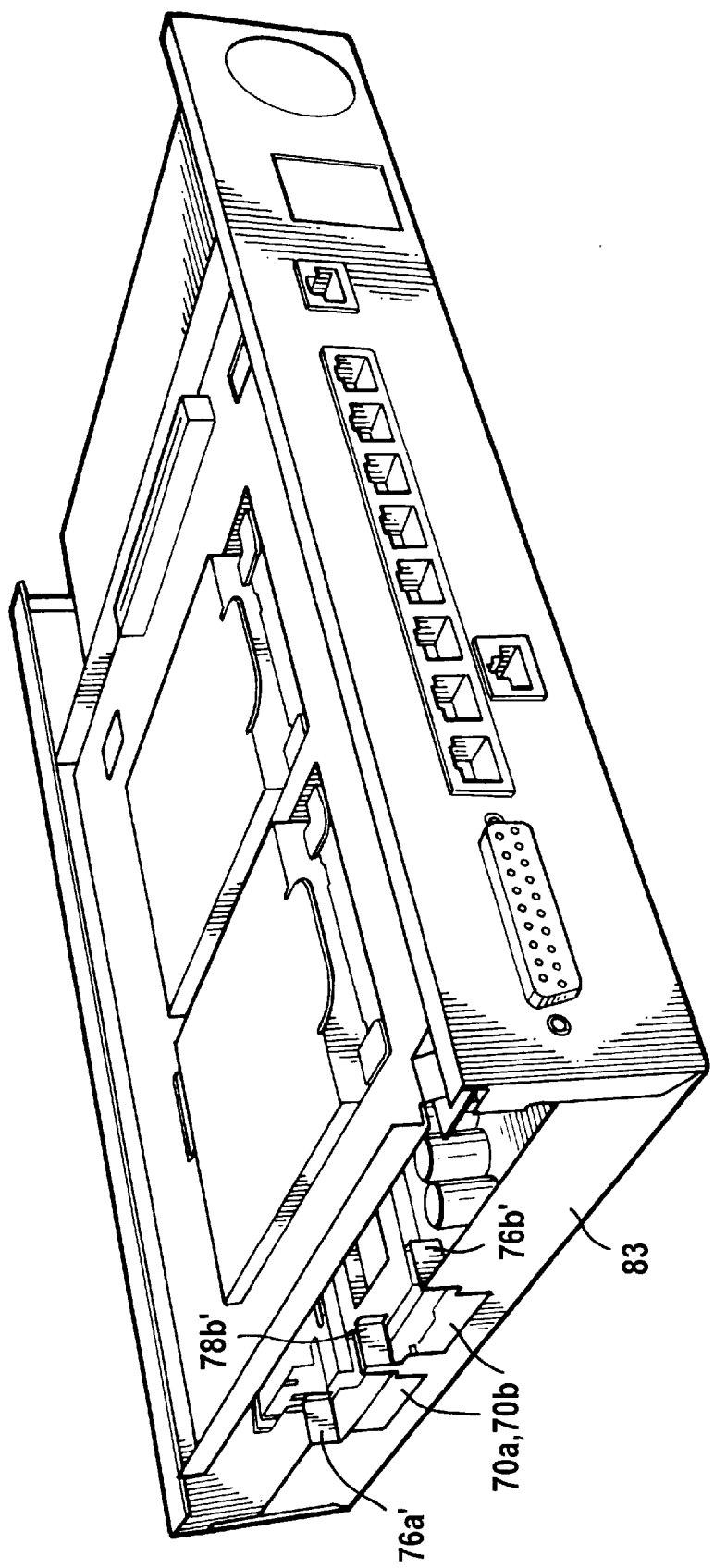
FIG. 7 is an illustration of a chassis tray of an embodiment of the present invention.

In addition, a substantially U-shaped middle support member 78 is disposed between the two grooves 70a and 70b. The support member 78 has an external portion 78c, which is an extension of the side surface 83. Disposed perpendicularly to the external portion 78c are two internal portions, or guide members, 78a and 78b, which are parallel to the tabs 76a, 76b, respectively. As shown in FIG. 7, the internal portions 78a, 78b, may have flanges 78a' and 78b', which are attached to the free end of the internal portions 78a, 78b respectively, and wrap around the air-outlet side of the fan in a plane that is parallel to the plane of the side surface 83. Similarly, the tabs 76a, 76b, may have tab extensions 76a', 76b', which are attached to the free end of the tabs 76a, 76b respectively, and wrap around the air-outlet side of the fan in a plane that is parallel to the plane of the side surface 83.

In practice, the fan 50a is installed by sliding the fan vertically downwards between the inner portion of the side surface 83 and the lip 74a in such a way as to have the air-inlet side of the fan face outwards, and the air-outlet side pointed inwards, towards the side surface 84 of the chassis tray 80. As can be seen from FIGS. 4 and 6, for any given fan, the dimensions of the groove 70a are chosen so as to have the length and height of the groove 70a be shorter, respectively, than the horizontal and vertical dimensions of the fan. In this way, once the fan has been slid into position, it is supported on the air-inlet side by the side surface 83 of the chassis tray 80.

Moreover, once installed, the fan 50a is supported from underneath by a shelf 72a, on one side by a tab 76a, and on the opposite side by an internal portion 78a of the middle support member 78. Finally, the lip 74a, the flange 78a', and the tab extension 76a' act to support the fan 50a from the air-outlet side. Thus, once mounted, the fan is disposed on the chassis tray 80 in such a way as to have its longitudinal axis lie in a plane that is parallel to the planes of each of the circuit boards 10, 20, 30, and HDD 40. Also, during operation, the fan 50a is kept from moving: (1) in a longitudinal direction by the lip 74a, the flange 78a', the tab extension 76a', and the side surface 83; and (2) in a transverse direction by the tab 76a and the middle support member 78a. In this manner, the fan-mounting assembly of the present invention counteracts the vibrational effects that are produced by the rotation of the blades of an operating fan.

However, it should be mentioned that, in order to fully exploit the advantages of this aspect of the invention, the fan-mounting assembly described above should preferably be made to close tolerances so as to achieve a maximum dampening of the fan blades' vibrational effects. In addition, regardless of the dimensions of the fan that is used, it must be ensured that the lips 74a, 74b, the flanges 78a', 78b', and the tab extensions 76a', 76b' extend towards the longitudinal axis of the fan far enough to adequately support the fan, and yet avoid blocking the passage of air from the air-outlet side of the fan. Similarly, care must be taken to ensure that the portions of the side surface 83 that extend over the air-inlet side of the fan do not actually impede the passage of ambient air into the air-inlet side of the fan.

Figure 8:
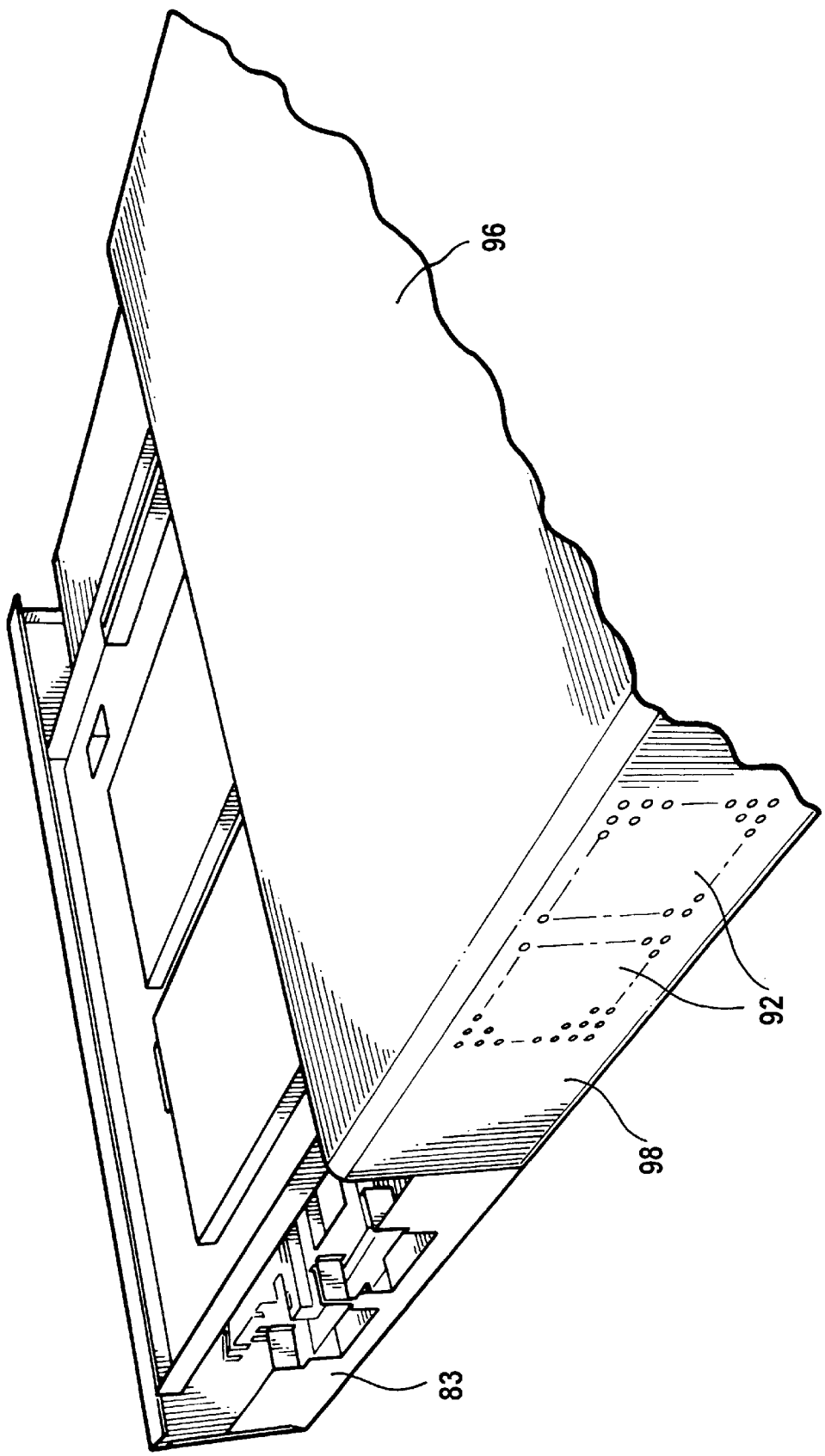
FIG. 8 is an illustration of a chassis sleeve, including air-inlet vents, of an embodiment of the present invention.

FIG. 8 shows one embodiment of the present invention, wherein the electronic system 100 comprises a chassis tray 80 and a chassis cover (or sleeve) 90 that slides over the chassis tray 80. In practice, once the fans 50a, 50b have been installed, the chassis cover 90 is closed before the electronic system 100 is activated. As can be seen from the embodiment depicted in FIG. 8, the chassis cover 90 includes a top surface 96, as well as sleeve surfaces 98 and 99.

Figure 5A:
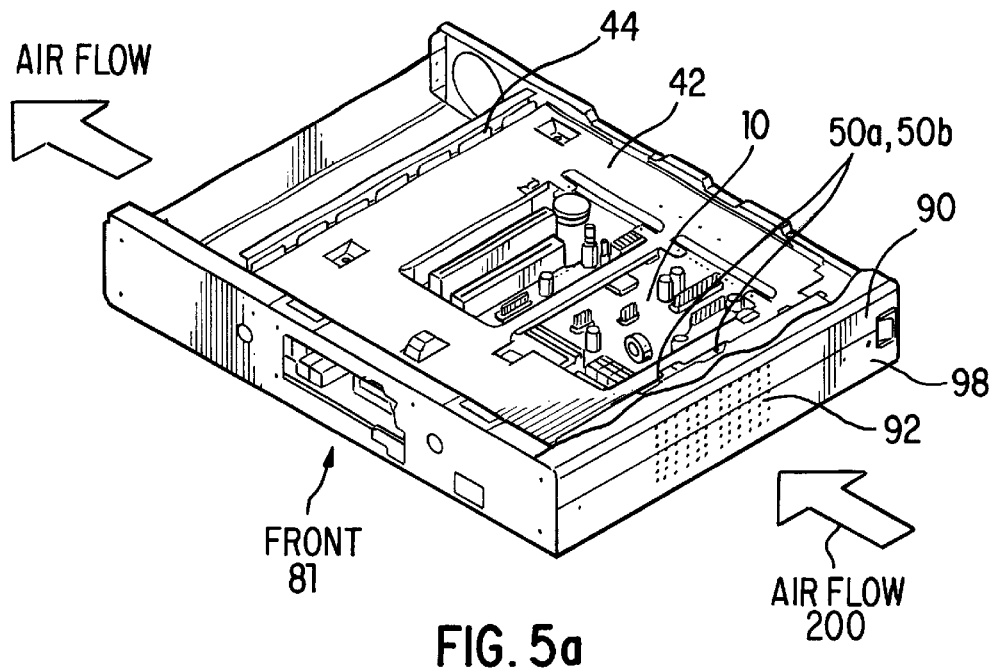
FIGS. 5a and 5b show a cooling path flowing through an embodiment of the present invention.
Figure 5B:
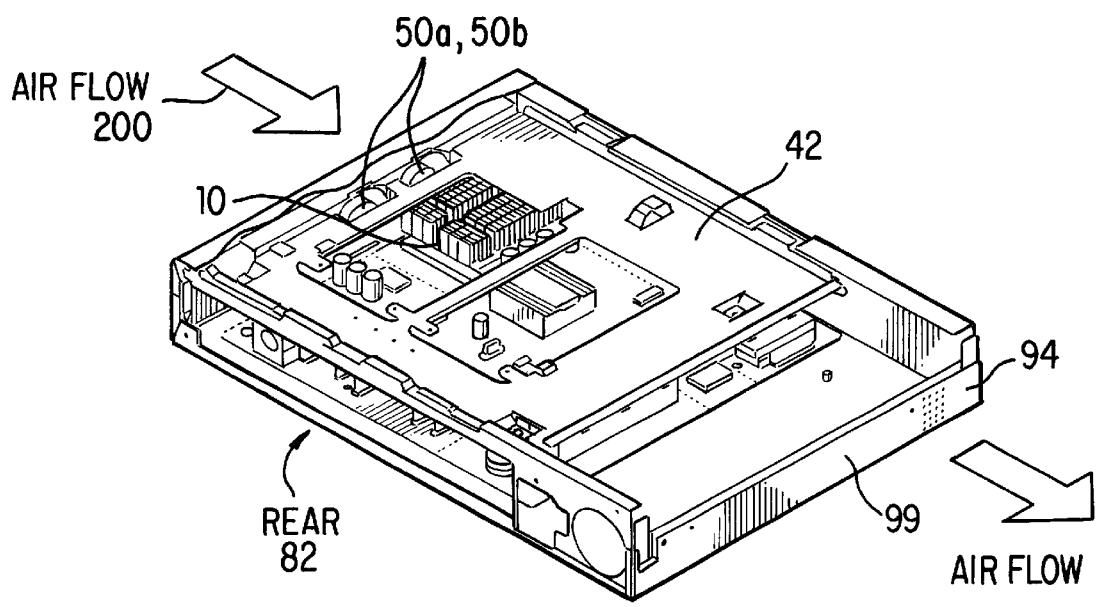
Figure 6:
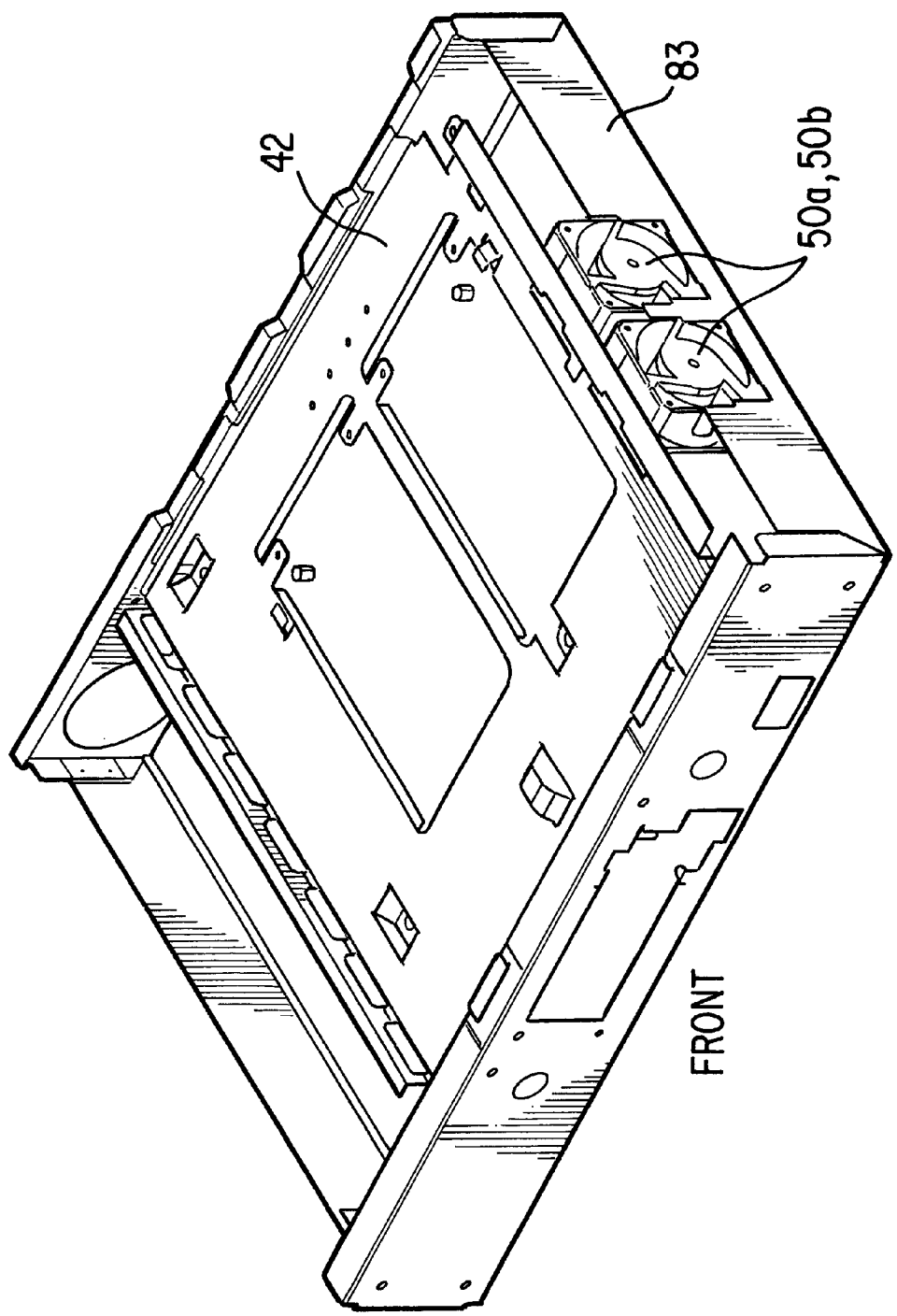
FIG. 6 shows a perspective view of an embodiment of the present invention, with a pair of fans in place.

FIGS. 5a and 5b show the completed electronic system 100, with a portion of the top surface 96 of the chassis cover 90 removed to show the arrangement of the components inside. In addition to the components identified above (e.g., cooling fans 50a, 50b), the system 100 includes a drive deck 42 and drive deck vent slots 44. The electronic system 100 also includes a motherboard 10, a daughter card 20, and a mezzanine board 30. However, the daughter card 20 and the mezzanine board 30 are not shown in FIGS. 5a and 5b in order to provide an unobscured view of the motherboard 10.

As shown in FIGS. 5 and 8, the sleeve surface 98 that slides over the side surface 83 of the chassis tray 80 includes sleeve inlet vent holes 92 that fit directly over the grooves 70a and 70b when the chassis cover 90 has been fully closed. Similarly, the sleeve surface 99 that is opposite the sleeve surface 98 includes sleeve outlet vent holes 94. Thus, in operation, when the fans 50a, 50b are turned on, ambient air is pulled in through the sleeve inlet vent holes 92, the grooves 70a, 70b, and the air-inlet side of the fans 50a, 50b. The air is then forced out of the air-outlet side of the fans, thereby travelling over and cooling, via convection, the circuit boards and other components that are housed within the electronic system 100.

Specifically, the stream of air created by the fans 50a, 50b flows horizontally through the electronic system 100, travelling over the top and bottom surfaces of the circuit boards 10, 20, 30, and the HDD 40. The direction of air flow through the system is shown generally by the arrows 200 in FIGS. 5a and 5b. Because the circuit boards 10, 20, 30, and the HDD 40 are stack mounted with vertical separations provided between them, the horizontal airflow provides convective cooling to the various surfaces in an efficient manner.

For example, with reference to FIGS. 5a and 5b, the HDD 40 is enclosed in a HDD cage that fits into one of the two rectangular openings on the drive deck 42. When the HDD 40 is placed on the drive deck 42, the top surface of the HDD 40, or the HDD cage, is above the drive deck 42, and the bottom surface of the HDD 40, or the HDD cage, is below the drive deck 42. For the area above the drive deck 42, the stream of air flows past the top surface of the HDD 40 and out of the drive deck vent slots 44. In doing so, the stream of cool ambient air provides convective cooling by absorbing heat from the top surface of the HDD 40. From the drive deck vent slots 44, the stream of air flows through the outlet vent holes 94 and out of the electronic system 100. The stream of air passes through the top and bottom surfaces of the circuit boards in a similar manner, allowing efficient convective cooling while still minimizing the profile of the electronic system 100.

In a preferred embodiment, the fans 50a, 50b receive electrical power via an electrical conductor (not shown) which may be plugged into a power supply. Alternatively, each fan may be equipped with a terminal (not shown) having electrically-conductive elements that extend through a side of the fan, wherein the terminal is inter-engageable with a mating terminal (e.g., a male-female arrangement), or a plug, carrying electrical power.

The physical structure of the fan-mounting assembly described above is essential to the efficient manufacture, operation, and maintenance of an embodiment of the present invention. Specifically, the fan-mounting assembly of the present invention does not require that the fans 50a, 50b be screwed onto the chassis tray 80, and/or the chassis cover 90. As such, from a manufacturing point of view, the invention provides for a simplified fan-mounting process. In addition, in the absence of screws, or any other permanent, or semi-permanent, fastening means, the fans 50a, 50b can be removed and re-installed almost effortlessly for maintenance purposes.

The construction of the electronic system 100, wherein the chassis 80 is in a simple sliding relationship with the chassis cover 90, lends itself well to a simplified maintenance process in which system components can be reached quickly and with little effort. However, in order for this to be possible, the two parts of the chassis must be able to slide relative to each other without any hindrance. On the other hand, when screws are used to fasten the fans 50a, 50b in place, some portion of the mounting screws (e.g., the head, or a nut) typically passes through a side of the chassis, thereby interfering with the relative sliding action of the chassis tray 80 and the chassis cover 90. Thus, the fan-mounting assembly of the present invention provides a simplified maintenance procedure not only with respect to the fans themselves, but also with regard to an entire system which can be put together, and taken apart, much more efficiently.

In addition, as was mentioned before, given the stacked configuration of the circuit boards 10, 20, 30, and HDD 40, the placement of the fans 50a, 50b as described above allows cooling air to reach all of the surfaces where heat-generating components reside, thus providing a more efficient cooling system. Furthermore, in one implementation, at least one of the interconnectors 15, 25 has holes or openings on it, preferably in the nonconductive portion of the interconnectors. Air also flows through these holes or openings on the interconnectors 15, 25 to provide further cooling. The separations or gap clearance provided by the interconnectors 15, 25 allow convective cooling over the top and bottom surfaces of the circuit boards 10, 20, 30, and HDD 40, while still minimizing the profile of the electronic system 100.

As shown in FIG. 1, the interconnectors 15, 25 and the pin connector 35 provide vertical separations to the circuit boards 10, 20, 30, and HDD 40 mounted in a stack. It should be apparent to one of ordinary skill in the art that the configuration in FIG. 1 can be turned 90-degrees clockwise, 180-degrees clockwise, or 270-degrees clockwise. In the case of the 90-degree shift, lateral separations are created between the circuit boards 10, 20, 30, and HDD 40. In the case of the 180-degree shift, the fan would be to the right of the circuit boards 10, 20, 30, and HDD 40, with the motherboard 10 being on the top of the stack and the HDD 40 at the bottom of the stack. Other configurations with the same principle are also possible.

Figure 9:
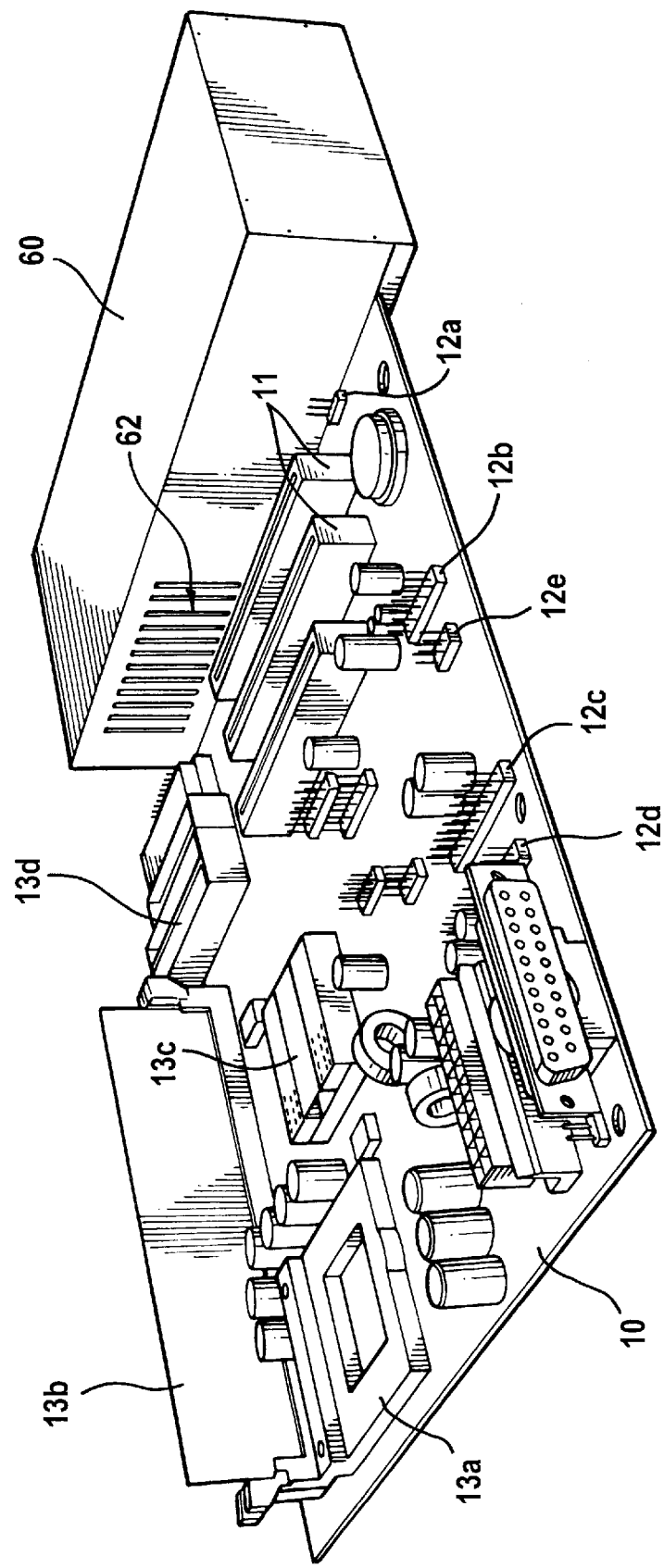
FIG. 9 illustrates a motherboard according to an embodiment of the present invention.

In a second preferred embodiment of the present invention, the circuit boards 10, 20, 30 are similarly stack mounted in a server appliance. However, connections among the circuit boards 10, 20, 30 are different. Instead of having the mezzanine board 30 connected to the daughter card 20, which connects to the motherboard 10, the mezzanine board 30 is connected directly to the motherboard 10 via a PCI slot extender card. Furthermore, instead of using a PCI extender card to connect a daughter card 20 with a motherboard 10, a male connector and a female connector combination is used. FIG. 9 illustrates the motherboard 10 according to this embodiment of the present invention. The motherboard 10 is the main circuit board and provides the main computing capability of the server appliance. It has connectors for attaching devices to buses. The motherboard 10 may, for example, include central processing unit (CPU) socket 13a, memory slots 13b, chipset 13c, and enhanced integrated drive electronics (EIDE) interface 13d. The motherboard 10 further comprises connective regions that include male connectors 12a–12e and PCI slot 11. The male connector(s) is utilized to connect the daughter card 20 with the motherboard 10, and the PCI slot 11 is utilized to connect the mezzanine board 30 with the motherboard 10. A power supply 60, which is not a part of the motherboard 10, is also shown in the figure. Like the motherboard 10, the power supply 60 is also housed inside the chassis of the server appliance. In the embodiment, the power supply 60 is enclosed in a power supply cage, which has openings 62 that serve as vents for airflow.

Figure 10:
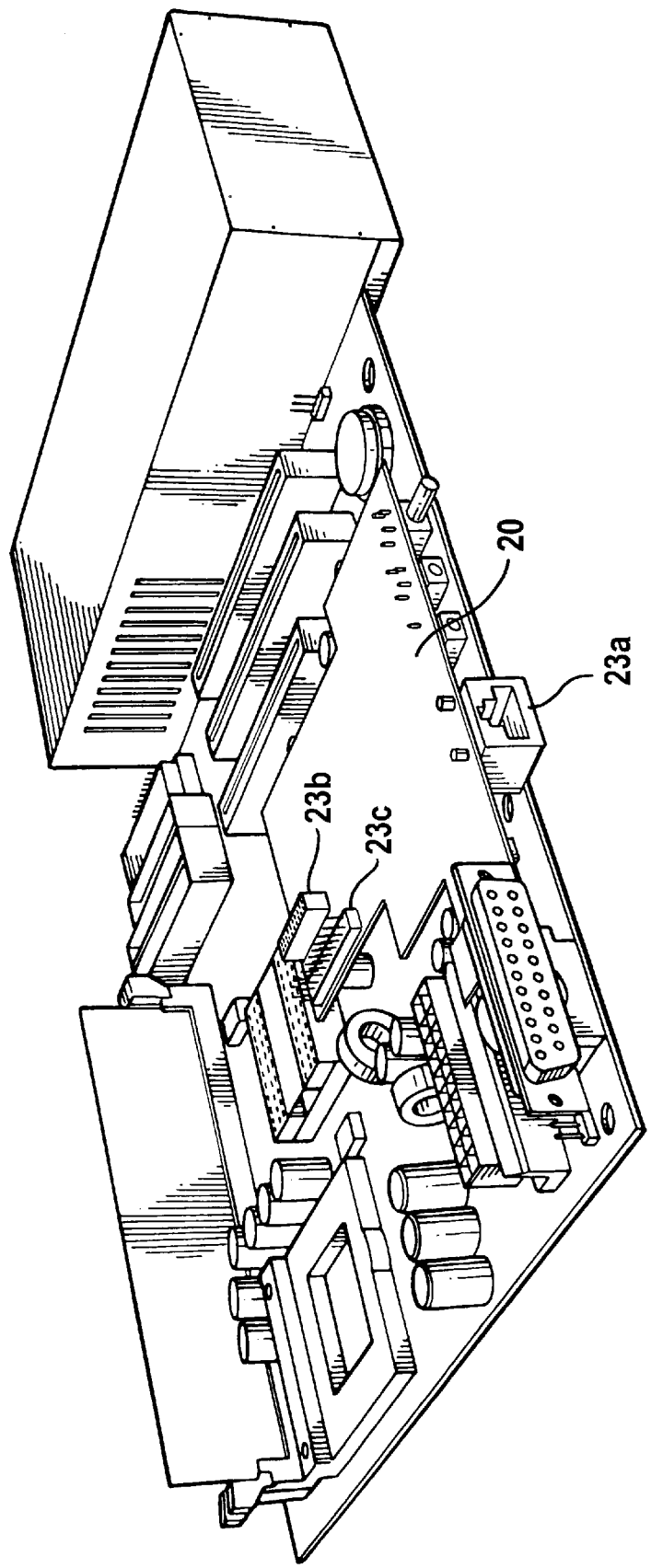
FIG. 10 illustrates a first supplemental card portion connected to the motherboard via a first interconnector according to an embodiment of the present invention.

FIG. 10 illustrates the daughter card 20 connected to the motherboard 10 via an interconnector according to an embodiment of the present invention. The daughter card 20 is a circuit board that plugs into another circuit board. The daughter card 20 has the ability to access the motherboard components, such as memory and CPU, directly, instead of sending data through the slower expansion bus. In addition, the daughter card 20 provides additional connectors and additional I/O pins to the motherboard 10. For example, modem port 23a, I/O connector 23b, and printer port header 23c are provided by the daughter card 20. In the embodiment, the daughter card 20 and the motherboard 10 are connected via an interconnector formed by a mounted male connector and a mounted female connector. One of the male connectors 12a–12e, or a plurality of them, on the motherboard 10 is utilized to serve as the connective region (s) to connect the daughter card 20 with the motherboard 10. The bottom surface of the daughter card 20 also has a connective region(s) in the form of a female connector. The exposed pins of the male connector on the motherboard 10 are inserted into the holes of the female connector on the bottom surface of the daughter card 20. This electronically connects the daughter card 20 with the motherboard 10, while creating vertical separation or gap clearance between them to allow a stream of air to flow through them. In another embodiment, the location of the male connector and the female connector is reversed. The male connector is integrated with, and mounted on, the bottom surface of the daughter card 20, while the female connector is mounted on the motherboard 10.

The interconnector between the daughter card 20 and the motherboard 10 may also be formed by a male—male connector that fits vertically into the connective regions on the top surface of the motherboard 10 and the bottom surface of the daughter card 20. In this case, a connective region in the form of a female connector is provided on each of the top surface of the motherboard 10 and the bottom surface of the daughter card 20. The interconnector electrically connects the female connectors mounted on the surfaces.

Figure 11:
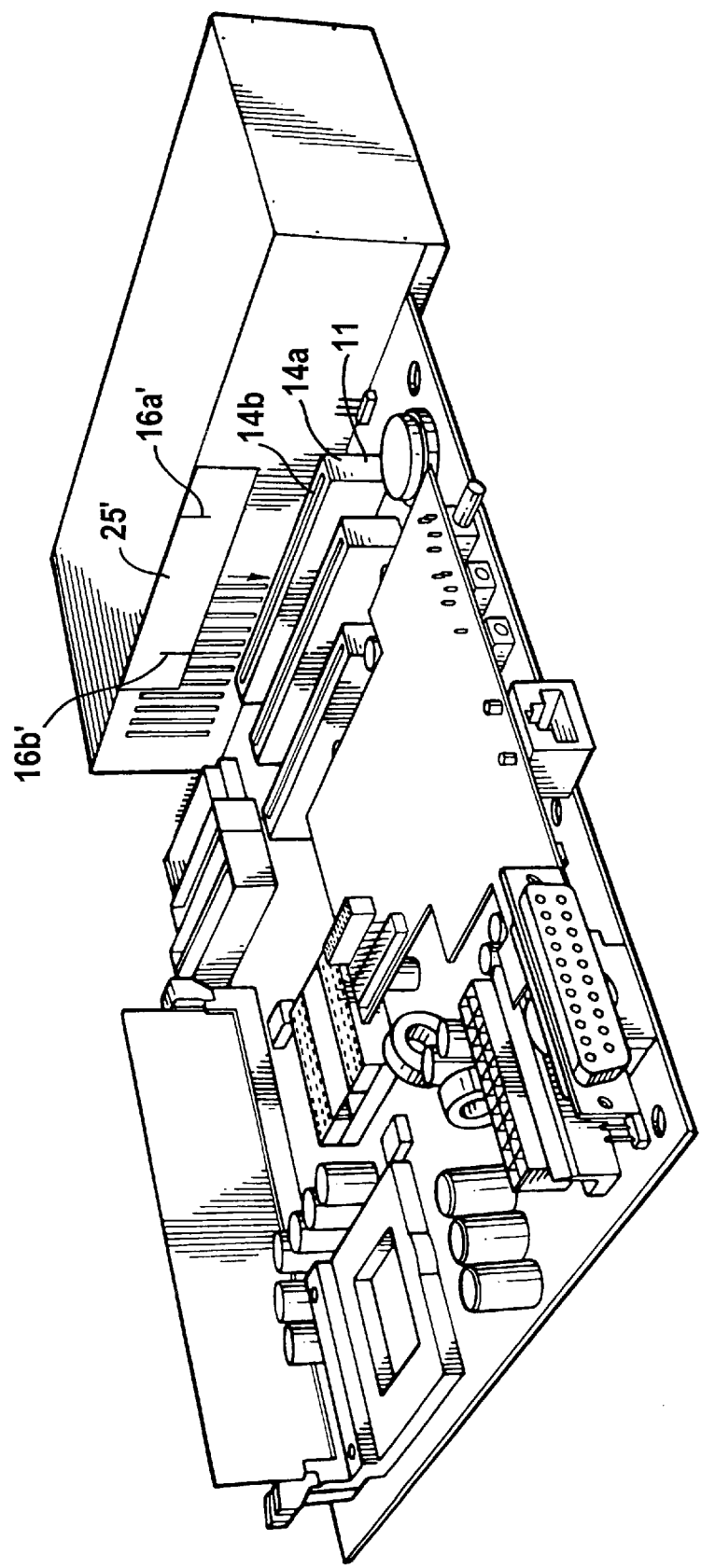
FIG. 11 illustrates a second interconnector that connects a motherboard with a second supplemental card portion positioned above the first supplemental card portion according to an embodiment of the present invention.

To bridge the mezzanine board 30 with the motherboard 10, a second interconnector 25' is used. FIG. 11 illustrates an example of the second interconnector 25' that connects the motherboard 10 with the mezzanine board 30 positioned above the daughter card 20 according to an embodiment of the present invention. In one implementation, the interconnector 25' is a PCI slot extender card. As shown in FIG. 11, the PCI slot 11, which serves as the connective region of the motherboard 10 for connecting the motherboard 10 with the mezzanine board 30, comprises a molded outer connector body 14a having an internal cavity 14b. The interconnector 25' is inserted into the internal cavity 14b of the PCI slot 11. The interconnector 25' fits vertically into the PCI slot 11, and the length of the interconnector 25' depends on the amount of separation required between the mezzanine board 30 and the daughter card 20. In the embodiment, the interconnector 25' has a notch on each side. The notches match locking features on corresponding PCI slots, allowing the interconnector 25' to be properly inserted into the PCI slots. For example, the notch 16b' matches the locking feature on the PCI slot 11 located on the top surface of the motherboard 10.

Figure 12:
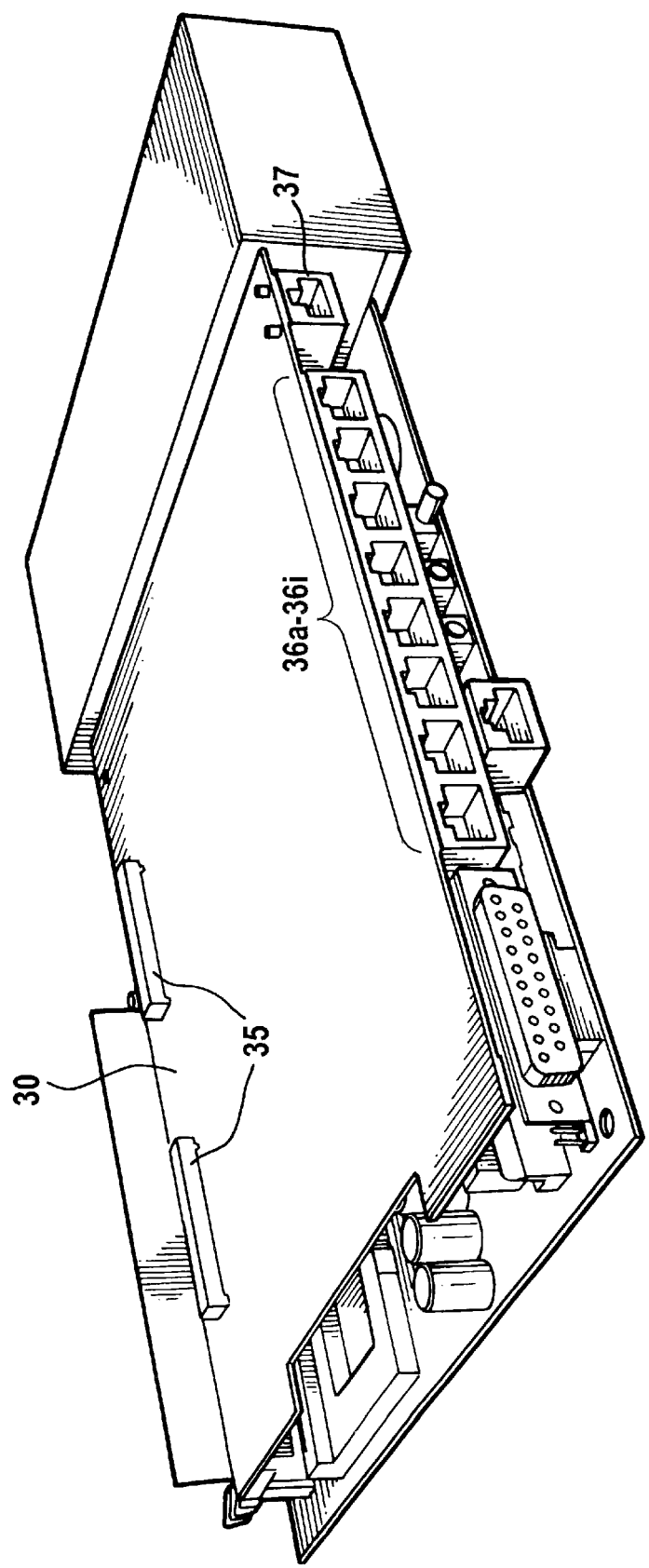
FIG. 12 illustrates a second supplemental card portion connected to the motherboard via a second interconnector according to an embodiment of the present invention.

FIG. 12 illustrates the mezzanine board 30 connected to the motherboard 10 via the interconnector 25' according to an embodiment of the present invention. Like the top surface of the motherboard 10 that has the PCI slot 11, the bottom surface of the mezzanine board 30 also has a connective region in the form of a PCI slot. The end of the interconnector 25' with the notch 16a' is inserted into the PCI slot on the bottom surface of the mezzanine board 30. This connects the mezzanine board 30 with the motherboard 10 and provides PCI interface between the mezzanine board 30 and the motherboard 10. As illustrated in FIG. 12, the mezzanine board may, for example, include controllers, HDD connector 35, local area network (LAN) switch ports 36a–36i, and wide area network (WAN) port 37. The LAN switch ports 36a–36i are utilized for computers that are geographically close together. The WAN port 37 is utilized for computers that are farther apart and are connected by, for example, telephone lines or radio waves.

FIG. 13 illustrates a side view of the inside of the server appliance having circuit boards and interconnectors connecting them in accordance with the second preferred embodiment. In this example, a cooling fan 50 is placed to the left of the circuit boards 10, 20, 30, and HDD 40. The interconnectors 15', 25' and the pin connector 35 provide vertical separations to the circuit boards 10, 20, 30, and HDD 40. In this configuration, because the daughter card 20 and the mezzanine board 30 are not connected together, air is able to freely flow through the whole top surface of the daughter card 20. As was described in detail previously, in operation, the cooling fan 50 produces airflow that travels through the various openings and over the top and bottom surfaces of the circuit boards 10, 20, 30. In one implementation, at least one of the interconnectors 15', 25' has holes or openings on it. These holes or openings are provided preferably in the nonconductive portion of the interconnectors. Air also flows through these holes or openings on the interconnectors 15', 25' to provide further cooling. The separations provided by the interconnectors 15', 25' not only allow convective cooling over the top and bottom surfaces of the circuit boards 10, 20, 30, and HDD 40, but also minimize the profile of the server appliance.

According to another embodiment of the present invention, the circuit boards 10, 20, 30 are similarly stack mounted in a server appliance. However, the mezzanine board 30 is connected directly to the motherboard 10 via a PCI slot extender card and the daughter card 20 is connected to the mezzanine board 30 via a male connector and a female connector combination or a male—male connector and two female connectors combination.

In mounting the circuit boards 10, 20, 30, and HDD 40 in a stack, it is important that the circuit boards be properly aligned so that the interconnectors 15, 25, or 15', 25', are securely mated. For example, it must be ensured that the daughter card 20 and the mezzanine board 30 are properly aligned with the motherboard 10 when they are interconnected in the manufacturing process. According to an embodiment of the present invention, the daughter card 20 and the mezzanine board 30 are provided with holes that allow an assembler to view the interconnectors as they are being mated.

FIG. 4 illustrates a viewing region on the mezzanine board 30 that facilitates an alignment process according to an embodiment of the present invention. FIG. 4 is a perspective view showing a motherboard 10 and a mezzanine board 30 within a chassis tray 80. The daughter card 20 and the interconnectors are not shown in this figure, as they are positioned between the motherboard 10 and the mezzanine board 30. The mezzanine board 30 is provided with a viewing region 31, which may, for example, be holes or openings. When an assembler is aligning the mezzanine board 30 for connection to either the daughter card 20 or the motherboard 10, the assembler is able to observe the interconnector 25 or 25' and the connective region(s) with which the interconnector 25 or 25' is to be mated through the viewing region 31.

In automated assembly, a detecting device may also determine whether an interconnector is properly connected with a connective region through the viewing region 31. This ensures proper alignment of the mezzanine board 30 and the circuit board to which the mezzanine board 30 is to be connected. While the viewing region 31 may be placed anywhere on the daughter card 20 and the mezzanine board 30, it is preferably located near the interconnection sites. This allows interconnectors and the connective regions to be easily observed.

According to another embodiment of the present invention, alignment holes are provided on the circuit boards. For example, the viewing region 31 and the viewing region on the daughter card 20 may serve as alignment holes. Alternatively, other holes or openings may be provided as alignment holes. The alignment holes may be located so that they are aligned when the circuit boards 20, 30 are properly aligned with respect to each other and/or with respect to the motherboard 10. This embodiment is particularly suited for automated assembly. A rod may, for example, protrude from the motherboard 10, and the alignment holes in the daughter card 20 and the mezzanine board 30 may be positioned so that the rod runs through them. As such, proper alignment of the holes, and thus the circuit boards 10, 20, 30, is ensured when the rod is able to pass through all of the boards simultaneously. In one embodiment, the rod is removably attached to the motherboard 10 so that the rod is removed when the assembly process of aligning and connecting the circuit boards 10, 20, 30 is completed. Furthermore, the rod and the holes may contain a "key" feature, such as a notch, to ensure that the circuit boards 10, 20, 30 are properly aligned.

While the foregoing description refers to particular embodiments of the present invention, it will be understood that the particular embodiments have been presented for purposes of illustration and description. They are not intended to be exhaustive or to limit the invention to the precise forms disclosed. Many modifications and variations are possible in light of the above teachings and may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An electronic system, comprising:
   a motherboard having electronic circuits disposed thereon and at least one of a first connective region and a second connective region;
   a first supplemental card portion positioned above the motherboard, the first supplemental card portion including at least one of a third connective region and a fourth connective region;
   a first interconnector connecting the motherboard with the first supplemental card portion, the first interconnector including a connection mechanism adapted to connect the first connective region with the third connective region;
   a second supplemental card portion positioned above the first supplemental card portion, the second supplemental card portion including a fifth connective region on one of its surfaces;
   a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations;
   a chassis tray having a front surface, a back surface, a first side surface, and a second side surface; and
   a fan, the fan being slidably mounted on said first side surface of the chassis tray, and the motherboard, the first and second supplemental card portions, and the first and second interconnectors being disposed within an interior of the chassis tray, wherein the fan is parallel to a plane of the first side surface such that air flows in a direction perpendicular to the plane of the first side surface, and the fan is located adjacent to the first side surface along the plane of the first side surface.

2. An electronic system, comprising:
   a motherboard having electronic circuits disposed thereon and at least one of a first connective region and a second connective region;
   a first supplemental card portion positioned above the motherboard, the first supplemental card portion including at least one of a third connective region and a fourth connective region;
   a first interconnector connecting the motherboard with the first supplemental card portion, the first interconnector including a connection mechanism adapted to connect the first connective region with the third connective region;
   a second supplemental card portion positioned above the first supplemental card portion, the second supplemental card portion including a fifth connective region on one of its surfaces;
   a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations;
   a storage drive having a seventh connective region; and
   a third interconnector connecting the second supplemental card portion with the storage drive, the third interconnector including a connection mechanism adapted to connect the seventh connective region with a sixth connective region on the second supplemental card portion, wherein the third interconnector provides separation between the second supplemental card portion and the storage drive to allow convective cooling by air flowing through the separation.

3. The electronic system according to claim 2, further comprising:
   a chassis tray having a front surface, a back surface, a first side surface, and a second side surface; and
   a fan, the fan being slidably mounted on said first side surface of the chassis tray, and the motherboard, the first and second supplemental card portions, the storage drive, and the first, second, and third interconnectors being disposed within an interior of the chassis tray.

4. The electronic system according to claim 2, wherein the motherboard, the first supplemental card portion, the second supplemental card portion and the storage drive are parallel to each other, and wherein the interconnectors are perpendicular to the motherboard, the first supplemental card portion and the second supplemental card portion.

5. The electronic system according to claim 4, further comprising:
   a chassis tray having a front surface, a back surface, a first side surface, and a second side surface; and
   a fan, said motherboard, first and second supplemental card portions, storage drive, and first, second, and third interconnectors being disposed within an interior of the chassis tray, said fan being slidably mounted on said first side surface of the chassis tray, and the longitudinal axis of said fan being parallel to the plane of each of the motherboard, the storage drive, and the first and second supplemental card portions.

6. An electronic system, comprising:
   a motherboard having electronic circuits disposed thereon and at least one of a first connective region and a second connective region;
   a first supplemental card portion positioned above the motherboard, the first supplemental card portion including at least one of a third connective region and a fourth connective region;
   a first interconnector connecting the motherboard with the first supplemental card portion, the first interconnector including a connection mechanism adapted to connect the first connective region with the third connective region;

a second supplemental card portion positioned above the first supplemental card portion, the second supplemental card portion including a fifth connective region on one of its surfaces; and a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations, wherein viewing regions are provided on the first supplemental card portion and the second supplemental card portion to allow the interconnectors to be viewed during alignment of the first supplemental card portion with the motherboard and alignment of the second supplemental card portion with the first supplemental card portion.

7. The electronic system according to claim 6, wherein the viewing regions are holes that are located near the connective regions.

8. An electronic system, comprising:

a motherboard having electronic circuits disposed thereon and at least one of a first connective region and a second connective region;

a first supplemental card portion positioned above the motherboard, the first supplemental card portion including at least one of a third connective region and a fourth connective region;

a first interconnector connecting the motherboard with the first supplemental card portion, the first interconnector including a connection mechanism adapted to connect the first connective region with the third connective region;

a second supplemental card portion positioned above the first supplemental card portion, the second supplemental card portion including a fifth connective region on one of its surfaces; and a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations, wherein an alignment hole is provided to each of the first supplemental card portion and the second supplemental card portion, the alignment holes being aligned when the first and second supplemental card portions are properly stacked.

9. The electronic system according to claim 8, further comprising a removable rod for facilitating an assembly process of the electronic system, wherein the removable rod is removably attached to the motherboard, the removable rod inserting into each of the alignment holes when the motherboard and the supplemental card portions are properly stacked, the removable rod being removed when the assembly process is complete.

10. The electronic system according to claim 9, wherein at least one of the rod or any one of the alignment holes includes a notch to ensure that the motherboard and the supplemental card portions are properly aligned.

11. An electronic system, comprising:

a motherboard having electronic circuits disposed thereon and at least one of a first connective region and a second connective region;

a first supplemental card portion positioned above the motherboard, the first supplemental card portion including at least one of a third connective region and a fourth connective region;

a first interconnector connecting the motherboard with the first supplemental card portion, the first interconnector including a connection mechanism adapted to connect the first connective region with the third connective region;

a second supplemental card portion positioned above the first supplemental card portion, the second supplemental card portion including a fifth connective region on one of its surfaces; and a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations, wherein the electronic system is a computer system, the computer system is a server system, and the first supplemental card portion is a daughter card and the second supplemental card portion is a mezzanine board.

12. The electronic system according to claim 11, wherein the first connective region is a Peripheral Component Interconnect (PCI) slot on a top surface of the motherboard and the third connective region is a PCI slot on a bottom surface of the daughter card, and the first interconnector is a PCI slot extender card having the connection mechanism of providing notches that match locking features on the PCI slots.

13. The electronic system according to claim 12, wherein the fourth connective region is a female connector mounted on the top surface of the daughter card and the fifth connective region is a female connector mounted on a bottom surface of the mezzanine board, and the second interconnector is a male—male connector having the connection mechanism of providing conductive pins protruding from both sides.

14. The electronic system according to claim 11, wherein the first connective region is a female connector mounted on the top surface of the motherboard and the third connective region is a female connector mounted on the bottom surface of the daughter card, and the first interconnector is a male—male connector having the connection mechanism of providing conductive pins protruding from both sides.

15. The electronic system according to claim 14, wherein the second connective region is a Peripheral Component Interconnect (PCI) slot on the top surface of the motherboard and the fifth connective region is a PCI slot on the bottom surface of the mezzanine board, and the second interconnector is a PCI slot extender card having the connection mechanism of providing notches that match locking features on the PCI slots.

16. The electronic system according to claim 11, wherein the first connective region and the first interconnector are integrated together as a male connector mounted on the motherboard, and the third connective region is a female connector mounted on the bottom surface of the daughter card.

17. The electronic system according to claim 11, wherein viewing regions are provided on the daughter card and the mezzanine board to allow the interconnectors to be viewed during alignment of the daughter card with the motherboard and alignment of the mezzanine board with the daughter card.

18. The electronic system according to claim 17, wherein the viewing regions are holes that are located near the connective regions.

19. The electronic system according to claim 11, wherein an alignment hole is provided to each of the daughter card and the mezzanine board, the alignment holes being aligned when the daughter card and the mezzanine board are properly stacked.

20. The electronic system according to claim 19, further comprising a removable rod for facilitating an assembly process of the electronic system, wherein the removable rod is removably attached to the motherboard, the removable rod inserting into each of the alignment holes when the motherboard, the daughter card and the mezzanine board are properly stacked, the removable rode being removed when the assembly process is complete.

21. An electronic system, comprising:
a motherboard having electronic circuits disposed thereon and at least one of a first connective region and a second connective region;
a first supplemental card portion positioned above the motherboard, the first supplemental card portion including at least one of a third connective region and a fourth connective region;
a first interconnector connecting the motherboard with the first supplemental card portion, the first interconnector including a connection mechanism adapted to connect the first connective region with the third connective region;
a second supplemental card portion positioned above the first supplemental card portion, the second supplemental card portion including a fifth connective region on one of its surfaces; and
a second interconnector connecting the second supplemental card portion with one of the motherboard and the first supplemental card portion, wherein the first and second interconnectors provide a first separation between the motherboard and the first supplemental card portion and a second separation between the supplemental card portions to allow convective cooling by air flowing through the separations,
wherein the second interconnector connects the first supplemental card portion with the second supplemental card portion, the second interconnector including a connection mechanism adapted to connect the fourth connective region with the fifth connective region, the third connective and fourth connective regions being provided on a same surface of the first supplemental card portion.

22. The electronic system according to claim 20, further comprising:
a storage drive having a seventh connective region; and
a third interconnector connecting the first supplemental card portion with the storage drive, the third interconnector including a connection mechanism adapted to connect the seventh connective region with a sixth connective region on the first supplemental card portion, wherein the third interconnector provides separation between the first supplemental card portion and the storage drive to allow convective cooling by air flowing through the separation.

23. The electronic system according to claim 21, wherein the first supplemental card portion is a mezzanine board and the second supplemental card portion is a daughter card.

24. In an electronic system having a chassis tray with a front surface, a back surface, a first side surface, and a second side surface, said first side surface defining a groove along a length thereof, a fan mounting assembly comprising:
a shelf, said shelf being horizontally disposed just beneath said groove on an inner portion of said first side surface of the chassis tray, said shelf extending in a direction that is perpendicular to said first side surface and towards said second side surface of the chassis tray, and said shelf being configured to receive a bottom surface of a fan;
a tab, said tab being disposed adjacent a first edge of said groove on the inner portion of said first side surface of the chassis tray, said tab lying in a plane that is perpendicular to a plane of the first side surface and to a plane of said shelf, and said tab being configured to support a first side surface of the fan; and
a guide member, said guide member being disposed adjacent a second edge of said groove on the inner portion of said first side surface of the chassis tray, said guide member lying in a plane that is parallel to a plane of said tab and said guide member being configured to support a second side surface of the fan;
wherein the fan is vertically slidably secured between said tab and said guide member, the fan is parallel to the plane of the first side surface such that air flows in a direction perpendicular to the plane of the first side surface, and the fan is located adjacent to the first side surface along the plane of the first side surface.

25. The fan mounting assembly of claim 24, wherein:
the groove is in the shape of a rectangle;
said first and second edges constitute the widths of said rectangle; and
the groove is configured such that the length thereof is shorter than the distance between said first and second side surfaces of the fan.

26. In an electronic system having a chassis tray with a front surface, a back surface, a first side surface, and a second side surface, said first side surface defining a groove along a length thereof, a fan mounting assembly comprising:
a shelf, said shelf being horizontally disposed just beneath said groove on an inner portion of said first side surface of the chassis tray, said shelf extending in a direction that is perpendicular to said first side surface and towards said second side surface of the chassis tray, and said shelf being configured to receive a bottom surface of a fan;
a tab, said tab being disposed adjacent a first edge of said groove on the inner portion of said first side surface of the chassis tray, said tab lying in a plane that is perpendicular to a plane of the first side surface and to a plane of said shelf, and said tab being configured to support a first side surface of the fan; and
a guide member, said guide member being disposed adjacent a second edge of said groove on the inner portion of said first side surface of the chassis tray, said guide member lying in a plane that is parallel to a plane of said tab, and said guide member being configured to support a second side surface of the fan, wherein the fan is vertically slidably secured between said tab and said guide member;
a lip member, said lip member being disposed on said shelf's free end and extending vertically upwards in a plane that is substantially perpendicular to the plane of the shelf;
a tab extension, said tab extension being disposed on said tab's free end and extending towards the longitudinal axis of said fan in a plane that is parallel to the plane of the first side surface of said chassis tray; and a flange, said flange being disposed on said guide member's free end and extending towards the longitudinal axis of said fan in a plane that is parallel to the plane of the first side surface of said chassis tray;

wherein said lip member, tab extension, and flange are configured to slidably receive the air-outlet side of said fan.

27. A method of providing circuit board separation in an electronic system, the method comprising:

providing a motherboard having electronic circuits disposed thereon and at least one of a first connective region and a second connective region;

positioning a first supplemental card portion above the motherboard, the first supplemental card portion including at least one of a third connective region and a fourth connective region;

coupling a first interconnector to the motherboard at the first connective region and to the first supplemental card portion at the third connective region, the first interconnector including a connection mechanism adapted to connect the first connective region with the third connective region;

positioning a second supplemental card portion above the first supplemental card portion, the second supplemental card portion including a fifth connective region on one of its surfaces;

providing a second interconnector that connects the second supplemental card portion with one of the motherboard and the first supplemental card portion, wherein the first and second interconnectors provide separation between the motherboard and the first supplemental card portion and between the supplemental card portions to allow convective cooling by air flowing through the separation;

providing a storage drive having a seventh connective region; and coupling a third interconnector to the second supplemental card portion at a sixth connective region and the storage drive at the seventh connective region, the third interconnector including a connection mechanism adapted to connect the seventh connective region with the sixth connective region, the sixth connective region being provided on the side opposite to the side of the second supplemental card portion that contains the fifth connective region, wherein the third interconnector provides separation between the second supplemental card portion and the storage drive to allow convective cooling by air flowing through the separation.

28. The method of claim 27, wherein the motherboard, the first supplemental card portion, the second supplemental card portion and the storage drive are parallel to each other, and wherein the interconnectors are perpendicular to the motherboard, the first supplemental card portion and the second supplemental card portion.

29. The method of claim 28, further comprising:

providing a chassis tray having a front surface, a back surface, a first side surface, and a second side surface; and slidably mounting a fan on an inner portion of said first side surface of the chassis tray, said motherboard, first and second supplemental card portions, storage drive, and first, second, and third interconnectors being disposed within an interior of the chassis tray, and the longitudinal axis of said fan being parallel to the plane of each of the motherboard, the storage drive, and the first and second supplemental card portions.

30. A method of providing circuit board separation in an electronic system, the method comprising:

providing a motherboard having electronic circuits disposed thereon and at least one of a first connective region and a second connective region;

positioning a first supplemental card portion above the motherboard, the first supplemental card portion including at least one of a third connective region and a fourth connective region;

coupling a first interconnector to the motherboard at the first connective region and to the first supplemental card portion at the third connective region, the first interconnector including a connection mechanism adapted to connect the first connective region with the third connective region;

positioning a second supplemental card portion above the first supplemental card portion, the second supplemental card portion including a fifth connective region on one of its surface;

providing a second interconnector that connects the second supplemental card portion with one of the motherboard and the first supplemental card portion, wherein the first and second interconnectors provide separation between the motherboard and the first supplemental card portion and between the supplemental card portions to allow convective cooling by air flowing through the separation; and providing viewing regions on the first supplemental card portion and the second supplemental card portion to allow the interconnectors to be viewed during alignment of the first supplemental card portion with the motherboard and alignment of the second supplemental card portion with the first supplemental card portion.

31. The method of claim 30, wherein the viewing regions are holes that are located near the connective regions.

32. A method of providing circuit board separation in an electronic system, the method comprising:

providing a motherboard having electronic circuits disposed thereon and at least one of a first connective region and a second connective region;

positioning a first supplemental card portion above the motherboard, the first supplemental card portion including at least one of a third connective region and a fourth connective region;

coupling a first interconnector to the motherboard at the first connective region and to the first supplemental card portion at the third connective region, the first interconnector including a connection mechanism adapted to connect the first connective region with the third connective region;

positioning a second supplemental card portion above the first supplemental card portion, the second supplemental card portion including a fifth connective region on one of its surface;

providing a second interconnector that connects the second supplemental card portion with one of the motherboard and the first supplemental card portion, wherein the first and second interconnectors provide separation between the motherboard and the first supplemental card portion and between the supplemental card portions to allow convective cooling by air flowing through the separation, wherein an alignment hole is provided to each of the first supplemental card portion and the second supplemental card portion, the alignment holes being aligned when the first and second supplemental card portions are properly stacked.

33. The method of claim 32, further comprising providing a removable rod for facilitating an assembly process of the electronic system, wherein the removable rod is removably attached to the motherboard, the removable rod inserting into each of the alignment holes when the motherboard and the supplemental card portions are properly stacked, the removable rode being removed when the assembly process is complete.

34. A method of providing circuit board separation in an electronic system, the method comprising:

providing a motherboard having electronic circuits disposed thereon and at least one of a first connective region and a second connective region;

positioning a first supplemental card portion above the motherboard, the first supplemental card portion including at least one of a third connective region and a fourth connective region;

coupling a first interconnector to the motherboard at the first connective region and to the first supplemental card portion at the third connective region, the first interconnector including a connection mechanism adapted to connect the first connective region with the third connective region;

positioning a second supplemental card portion above the first supplemental card portion, the second supplemental card portion including a fifth connective region on one of its surface;

providing a second interconnector that connects the second supplemental card portion with one of the motherboard and the first supplemental card portion, wherein the first and second interconnectors provide separation between the motherboard and the first supplemental card portion and between the supplemental card portions to allow convective cooling by air flowing through the separation, wherein the electronic system is a computer system, the computer system is a server system, the first supplemental card is a daughter card and the second supplemental card is a mezzanine board.

35. A method of providing cooling to an electronic system, the method comprising:

providing a fan with a top surface, a bottom surface, a first side surface, a second side surface, a rear air-inlet side, and a front air-outlet side;

providing a chassis tray, said chassis tray housing the electronic system's circuitry and components and having a front surface, a back surface, a first side surface, and a second side surface, said first side surface of the chassis tray defining a groove along the length thereof;

providing a shelf, said shelf being horizontally disposed just beneath said groove on an inner portion of said first side surface of the chassis tray, said shelf extending in a direction that is perpendicular to said first side surface and towards said second side surface of the chassis tray, and said shelf being configured to receive the bottom surface of a fan;

providing a lip member, said lip member being disposed on said shelf's free end and extending vertically upwards in a plane that is substantially perpendicular to the plane of the shelf;

providing a tab, said tab being disposed adjacent a first edge of said groove on an inner portion of said first side surface of the chassis tray, said tab lying in a plane that is perpendicular to the plane of the first side surface and to the plane of said shelf, and said tab being configured to support a first side surface of the fan;

providing a tab extension, said tab extension being disposed on said tab's free end and extending towards the longitudinal axis of said fan in a plane that is parallel to the plane of the first side surface of said chassis tray;

providing a guide member, said guide member being disposed adjacent a second edge of said groove on an inner portion of said first side surface of the chassis tray, said guide member lying in a plane that is parallel to the plane of said tab, and said guide member being configured to support a second side surface of the fan;

providing a flange, said flange being disposed on said guide member's free end and extending towards the longitudinal axis of said fan in a plane that is parallel to the plane of the first side surface of said chassis tray;

slidably mounting the fan into position such that the rear air-inlet side of the fan is disposed adjacent said groove, the bottom surface of the fan rests on said shelf, the first side surface of the fan is secured by said tab, the second side surface of the fan is secured by said guide member, the front air-outlet side of the fan is secured by said lip member, tab extension, and flange, and the rear air-inlet side of the fan is secured by said first side surface of the chassis tray; and operating the fan so as to enable the fan to draw ambient air in from its rear air-inlet side and provide cooling air to said circuitry and components through its front air-outlet side.

* * * * *